(12) United States Patent
Do et al.

(10) Patent No.: US 11,063,194 B2
(45) Date of Patent: Jul. 13, 2021

(54) ULTRA-SMALL LED ELECTRODE ASSEMBLY

(71) Applicant: SAMSUNG DISPLAY CO., LTD., Yongin-si (KR)

(72) Inventors: Young Rag Do, Seoul (KR); Yeon Goog Sung, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/070,184

(22) PCT Filed: Jan. 13, 2017

(86) PCT No.: PCT/KR2017/000458
§ 371 (c)(1),
(2) Date: Jul. 13, 2018

(87) PCT Pub. No.: WO2017/123039
PCT Pub. Date: Jul. 20, 2017

(65) Prior Publication Data
US 2019/0019930 A1    Jan. 17, 2019

(30) Foreign Application Priority Data

Jan. 14, 2016   (KR) .......................... 10-2016-0004845

(51) Int. Cl.
*H01L 25/075*   (2006.01)
*H01L 33/62*    (2010.01)
(Continued)

(52) U.S. Cl.
CPC .............. *H01L 33/62* (2013.01); *H01L 24/95* (2013.01); *H01L 33/38* (2013.01);
(Continued)

(58) Field of Classification Search
CPC ..... H01L 25/50; H01L 25/0753; H01L 33/62; H01L 27/124; H01L 27/153; H01L 33/20;
(Continued)

(56) References Cited

U.S. PATENT DOCUMENTS 7,825,328 B2   11/2010   Li
8,129,710 B2   3/2012    Cho et al.
(Continued)

FOREIGN PATENT DOCUMENTS

JP   2011-091257 A   5/2011
JP   2011-205106 A   10/2011
(Continued)

OTHER PUBLICATIONS

International Search Report for corresponding International Application No. PCT/KR2014/006122, dated Aug. 25, 2014, 2 pages.
(Continued)

*Primary Examiner* — Yu Chen
(74) *Attorney, Agent, or Firm* — Lewis Roca Rothgerber Christie LLP

(57) ABSTRACT

Provided is a ultra-small light-emitting diode (LED) electrode assembly including a base substrate; an electrode line formed on the base substrate, and including a first electrode and a second electrode formed in a line shape to be inter-digitated with each other while being spaced apart from each other; and at least one ultra-small LED device connected to the electrode line. A cross section of at least one of the first and second electrodes in a vertical direction has a height variation such that the first and second electrodes easily come in contact with the at least one ultra-small LED device.

6 Claims, 10 Drawing Sheets

(51) Int. Cl.
  *H01L 23/00* (2006.01)
  *H01L 33/38* (2010.01)
  *H01L 33/20* (2010.01)
(52) U.S. Cl.
  CPC .......... *H01L 25/0753* (2013.01); *H01L 33/20* (2013.01); *H01L 2224/95085* (2013.01); *H01L 2224/95101* (2013.01); *H01L 2224/95136* (2013.01); *H01L 2933/0066* (2013.01)
(58) Field of Classification Search
  CPC .......... H01L 2933/0066; H01L 27/15–27/156; H01L 2224/80143; H01L 2224/8014; H01L 2224/81143; H01L 2224/8114; H01L 2224/83143; H01L 2224/8314; H01L 2224/95085; H01L 2224/95101; H01L 2224/95136; H01L 2224/95143; H01L 2224/95145; H01L 33/38
  See application file for complete search history.

(56) References Cited

U.S. PATENT DOCUMENTS

| | | | |
|---|---|---|---|
| 8,330,173 | B2 | 12/2012 | Kim |
| 8,378,349 | B2 | 2/2013 | Ko et al. |
| 8,871,544 | B2 | 10/2014 | Jeong et al. |
| 9,112,112 | B2 | 8/2015 | Do et al. |
| 9,570,425 | B2 | 2/2017 | Do |
| 9,773,761 | B2 | 9/2017 | Do |
| 9,978,725 | B2 | 5/2018 | Do |
| 10,276,630 | B2 | 4/2019 | Lee et al. |
| 2003/0141507 | A1 | 7/2003 | Krames et al. |
| 2006/0023451 | A1* | 2/2006 | Han ................ H01L 25/0753 362/249.06 |
| 2007/0042520 | A1 | 2/2007 | Oh et al. |
| 2009/0137075 | A1 | 5/2009 | Yang et al. |
| 2009/0267049 | A1 | 10/2009 | Cho et al. |
| 2009/0303713 | A1 | 12/2009 | Chang et al. |
| 2011/0033976 | A1* | 2/2011 | Di Cioccio ............. H01L 24/24 438/107 |
| 2011/0254043 | A1 | 10/2011 | Negishi et al. |
| 2011/0272014 | A1 | 11/2011 | Mathai et al. |
| 2011/0309382 | A1 | 12/2011 | Löwgren |
| 2012/0181546 | A1 | 7/2012 | Tu |
| 2012/0248408 | A1 | 10/2012 | Paek et al. |
| 2013/0027623 | A1* | 1/2013 | Negishi ............... H01L 25/0753 349/42 |
| 2013/0221385 | A1 | 8/2013 | Shibata et al. |
| 2014/0034120 | A1 | 2/2014 | Wang et al. |
| 2014/0124801 | A1* | 5/2014 | Lee .................... H01L 25/0753 257/88 |
| 2014/0209858 | A1 | 7/2014 | Cha et al. |
| 2014/0209942 | A1* | 7/2014 | Dingemans .......... H05K 1/0283 257/88 |
| 2015/0062484 | A1 | 3/2015 | Lee et al. |
| 2017/0062684 | A1* | 3/2017 | Ikeda .................. H01L 25/0753 |
| 2017/0317228 | A1* | 11/2017 | Sung .................. H01L 33/0075 |
| 2018/0287010 | A1* | 10/2018 | Sung ....................... H01L 33/32 |

FOREIGN PATENT DOCUMENTS

| | | |
|---|---|---|
| JP | 2015-076585 A | 4/2015 |
| KR | 10-2008-0021023 A | 3/2008 |
| KR | 10-2009-0020869 A | 2/2009 |
| KR | 10-0903280 B1 | 6/2009 |
| KR | 10-2009-0121743 A | 11/2009 |
| KR | 10-2010-0066768 A | 6/2010 |
| KR | 10-2010-0091269 A | 8/2010 |
| KR | 10-2012-0022649 A | 3/2012 |
| KR | 10-2012-0120377 A | 11/2012 |
| KR | 10-2012-0122159 A | 11/2012 |
| KR | 10-1209449 B1 | 12/2012 |
| KR | 10-1429095 B1 | 8/2014 |
| KR | 10-1436123 B1 | 11/2014 |
| KR | 10-2015-0006798 A | 1/2015 |
| WO | WO 2016/080710 A1 | 5/2016 |
| WO | WO 2016/080712 A1 | 5/2016 |

OTHER PUBLICATIONS

Office Action issued in U.S. Appl. No. 15/528,046 by the USPTO, dated Aug. 10, 2018, 9 pages.
Office Action issued in U.S. Appl. No. 15/528,035 by the USPTO, dated Sep. 10, 2018, 11 pages.
Final Office Action issued in U.S. Appl. No. 15/528,035 by the USPTO, dated Mar. 15, 2019, 25 pages.
Office Action issued in U.S. Appl. No. 15/528,035 by the USPTO, dated Sep. 5, 2019, 15 pages.
Office Action issued in U.S. Appl. No. 15/528,046 by the USPTO, dated Sep. 12, 2019, 8 pages.
Final Office Action issued in U.S. Appl. No. 15/528,035 by the USPTO, dated Mar. 13, 2020, 17 pages.

* cited by examiner

ULTRA-SMALL LED ELECTRODE ASSEMBLY

TECHNICAL FIELD

The present invention relates to a ultra-small light-emitting diode (LED) electrode assembly, and more particularly, to a ultra-small LED electrode assembly which can be used to emit light.

BACKGROUND ART

A light-emitting diode (LED) is a semiconductor device having a structure, in which an n type semiconductor crystal in which a large number of carriers are electrons and a p type semiconductor crystal in which a large number of carriers are holes are connected to each other using characteristics of a compound semiconductor, and converts an electrical signal into light having a wavelength range of a desired region and emits the light.

Korean Laid-Open Patent Publication No. 2015-0006798 (publication date: Jan. 19, 2015) discloses a ultra-small LED electrode assembly and a manufacturing method thereof. The ultra-small LED electrode assembly may be manufactured by arranging ultra-small LED devices on an electrode line including first and second electrodes arranged to be interdigitated with each other.

In the ultra-small LED electrode assembly, the first and second electrodes are formed in a bar shape and arranged in parallel to each other in one direction. The ultra-small LED devices each have a cylindrical shape. The ultra-small LED electrode assembly may be manufactured by applying a solution containing the ultra-small LED devices onto the electrode line such that the ultra-small LED devices are placed on the electrode line.

In this case, light may be emitted when each of the ultra-small LED devices is connected to both the first and second electrodes but a large number of ultra-small LED devices among the plurality of ultra-small LED devices may not be connected to both the first and second electrodes. Accordingly, when the number of ultra-small LED devices which are not connected to both the first and second electrodes is large, light extraction efficiency may be low.

DISCLOSURE

Technical Problem

An embodiment of the present invention is directed to a ultra-small light-emitting diode (LED) electrode assembly capable of increasing the number of ultra-small LED devices to be connected to a first electrode and a second electrode.

Technical Solution

One aspect of the present invention provides a ultra-small LED electrode assembly including: a base substrate; an electrode line formed on the base substrate, and including a first electrode and a second electrode formed in a line shape to be interdigitated with each other while being spaced apart from each other; and at least one ultra-small LED device connected to the electrode line. A cross section of at least one of the first and second electrodes in a vertical direction has a height variation such that the first and second electrodes easily come in contact with the at least one ultra-small LED device.

The cross section of at least one of the first and second electrodes in the vertical direction may have a shape selected from among a semicircular shape, a polygonal shape, and a center-protruding shape.

Each of the first and second electrodes may include a mounting portion mounted on the base substrate and a protruding portion upwardly protruding from a central region of the mounting portion.

The at least one ultra-small LED device may have a pillar shape, a distance between the protruding portion of the first electrode and the protruding portion of the second electrode adjacent thereto may be greater than or equal to a length of the at least one ultra-small LED device, and a distance between the mounting portion of the first electrode and the mounting portion of the second electrode adjacent thereto may be less than the length of the at least one ultra-small LED device.

Another aspect of the present invention provides a ultra-small LED electrode assembly including: a base substrate; an electrode line formed on the base substrate, and including a first electrode and a second electrode formed in an island shape, the first and second electrodes being patterned to be interdigitated with each other while being spaced apart from each other; and at least one ultra-small LED device connected to the electrode line.

A plane of each of the first and second electrodes may have a shape selected from among a circular shape and a polygonal shape.

The first and second electrodes may be located to be interdigitated with each other to be spaced a certain distance from each other in multiple directions.

A cross section of at least one of the first and second electrodes in the vertical direction may have a shape selected from among a semicircular shape, a polygonal shape, and a center-protruding shape.

At least one among corners of the first or second electrode having the center-protruding shape may be chamfered.

At least one among corners of the first or second electrode having the center-protruding shape may be rounded.

Another aspect of the present invention provides a ultra-small LED electrode assembly including: a base substrate; an electrode line formed on the base substrate, and including a first electrode and a second electrode spaced apart from the first electrode; and at least one ultra-small LED device connected to the electrode line. One of the first and second electrodes has a lattice shape in which a penetration portion is patterned, and the other of the first and second electrodes has an island shape and is located in the penetration portion.

The first electrode may have a lattice shape including the penetration portion having a tetragonal shape, and the second electrode may have a tetragonal shape which is smaller in size than the penetration portion and be located at a center of the penetration portion.

A cross section of the first electrode in the vertical direction may have a shape selected from among a semicircular shape, a polygonal shape, and a center-protruding shape.

Advantageous Effects

In a ultra-small LED electrode assembly according to an embodiment of the present invention, an electrode line has a three-dimensional (3D) shape. Thus, in the ultra-small LED electrode assembly according to the embodiment of the present invention, during placing of a plurality of ultra-small LED devices on the electrode line, a larger number of ultra-small LED devices may come into contact with the electrode line than in a structure including an electrode line formed to a certain thickness.

Accordingly, the number of photons discharged to the outside from the ultra-small LED electrode assembly increases and thus the light extraction efficiency of the ultra-small LED electrode assembly may be remarkably improved.

MODES OF THE INVENTION

Figure 1:
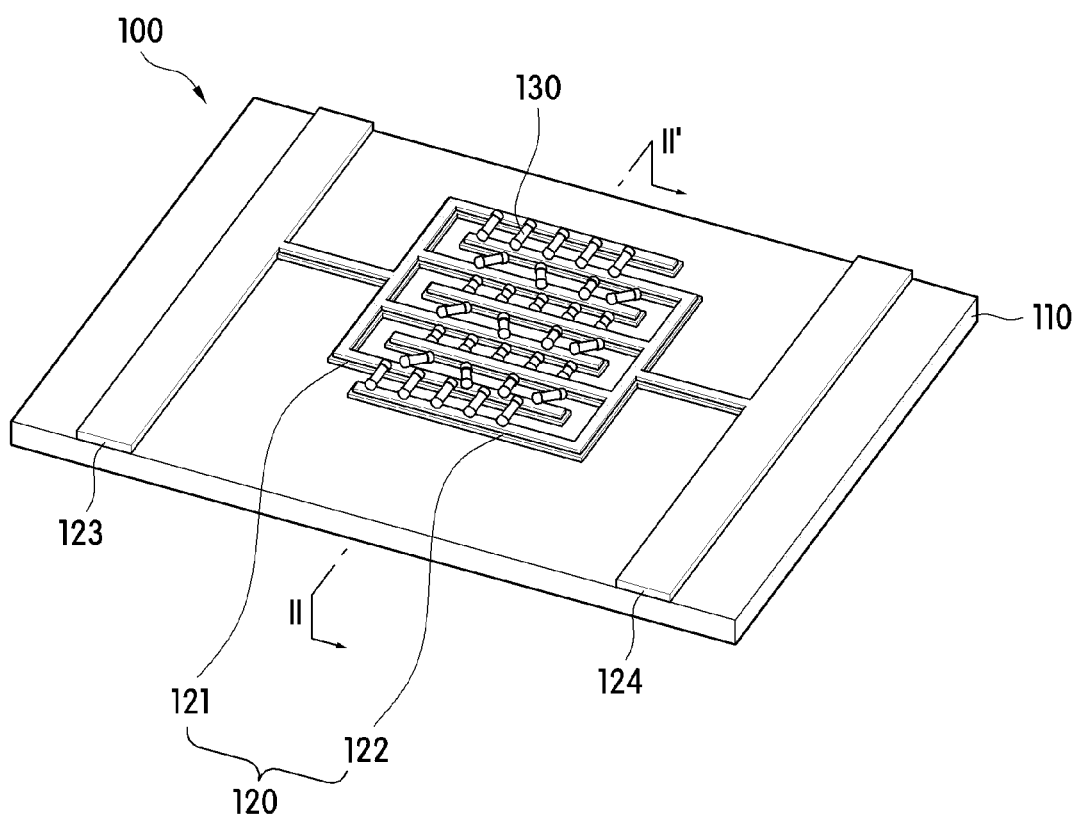
FIG. 1 is a diagram illustrating a ultra-small light-emitting diode (LED) electrode assembly according to a first embodiment of the present invention.

Hereinafter, exemplary embodiments of the present invention will be described in detail with reference to the accompanying drawings so that those of ordinary skill in the art can easily implement them. The present invention may be embodied in many different forms and is not limited to the embodiments set forth herein.

For clarity, a description of parts not related to describing the present invention is omitted here, and the same reference numerals are allocated to the same or similar components throughout the disclosure.

Components having the same structure in various embodiments will be allocated the same reference numeral and explained only in a representative embodiment, and components which are different from those of the representative example will be described in the other embodiments.

As used herein, when an element is referred to as being "connected to" another element, the element can be directly connected to the other element or be indirectly connected to the other element having an intervening element therebetween. It will be understood that the terms "comprise" and/or "comprising," when used herein, specify the presence of stated elements but do not preclude the presence or addition of one or more other elements unless mentioned otherwise.

Figure 2:
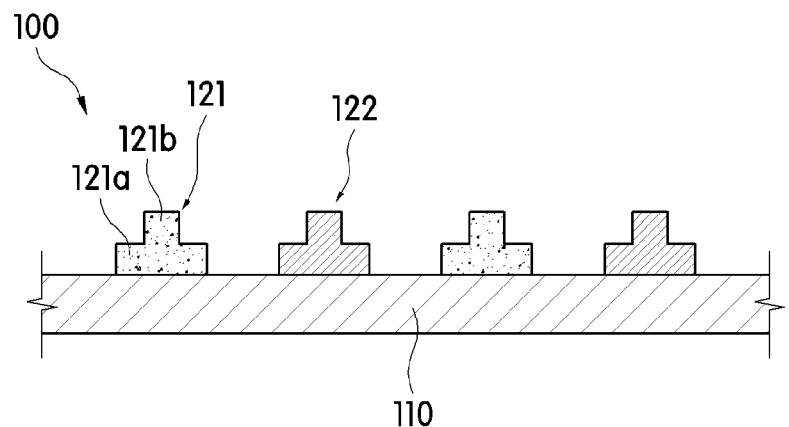
FIG. 2 is a cross-sectional view taken along line II-IT of the ultra-small LED electrode assembly of FIG. 1.
Figure 3:
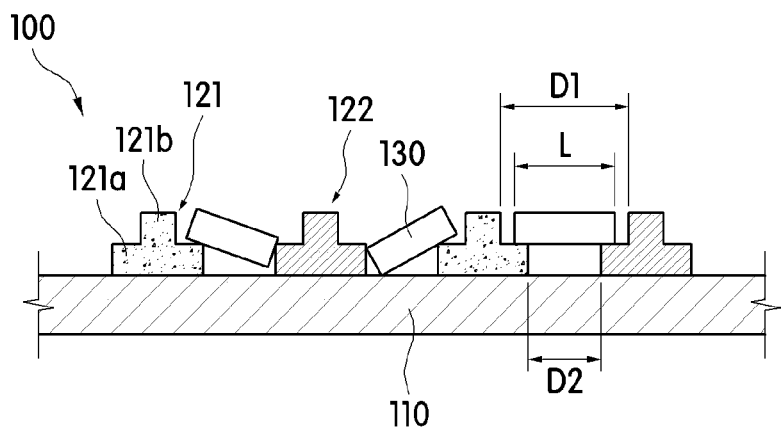
FIG. 3 is a diagram illustrating a state in which ultra-small LED devices of FIG. 2 are placed.
Figure 4:
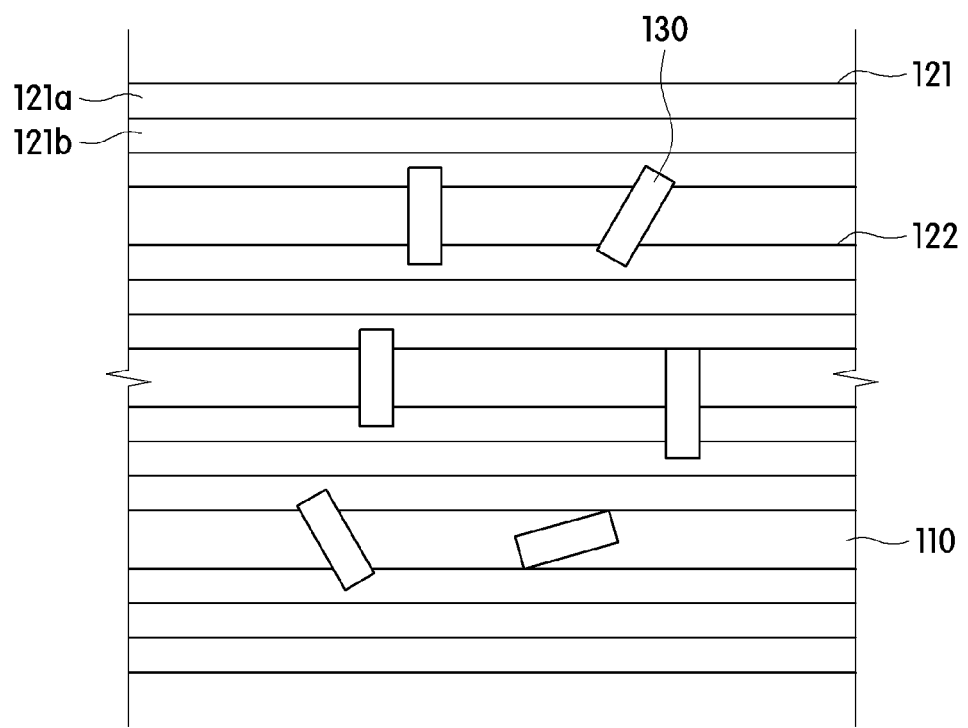
FIG. 4 is a top view of a part of the ultra-small LED electrode assembly of FIG. 3.

FIG. 1 is a diagram illustrating a ultra-small light-emitting diode (LED) electrode assembly according to a first embodiment of the present invention. FIG. 2 is a cross-sectional view taken along line II-II' of the ultra-small LED electrode assembly of FIG. 1. FIG. 3 is a diagram illustrating a state in which ultra-small LED devices of FIG. 2 are placed. FIG. 4 is a top view of a part of the ultra-small LED electrode assembly of FIG. 3.

Referring to FIGS. 1 to 4, a ultra-small LED electrode assembly 100 according to an embodiment of the present invention may include a base substrate 110, an electrode line 120, and ultra-small LED devices 130.

The base substrate 110 may be, for example, one selected from among a glass substrate, a quartz substrate, a sapphire substrate, a plastic substrate, and a bendable/flexible polymer film. However, the type of the base substrate 110 is not limited thereto and various other members may be used provided that electrodes can be formed thereon. The base substrate 110 may be formed of a transparent material.

An area of the base substrate 110 is not limited, and may be changed according to a manufacturer's design by taking into account an area of a first electrode 121 and an area of a second electrode 122 to be formed on the base substrate 110, and a size and a number of ultra-small LED devices connected to the first electrode 121 and the second electrode 122. For example, a thickness of the base substrate 110 may be in a range of 100 µM to 1 mm but is not limited thereto.

The electrode line 120 is formed on the base substrate 110. The electrode line 120 may include, for example, a plurality of first electrodes 121 and a plurality of second electrodes 122. The first electrodes 121 may be in the form of a line.

The second electrodes 122 may be in the form of a line. The second electrodes 122 and the first electrodes 121 are interdigitated with each other while being spaced apart from each other. A second electrode 122 may be located at a side of a first electrode 121, and another first electrode 121 may be located at a side of the second electrode 122. The second electrodes 122 may be formed on the same plane as the first electrodes 121.

A first lead electrode 123 and a second lead electrode 124 may be formed on the base substrate 110. The first lead electrode 123 and the second lead electrode 124 may be formed on the same plane as the first electrodes 121 and the second electrodes 122.

The first electrodes 121 are electrically connected to the first lead electrode 123, and the second electrodes 122 are electrically connected to the second lead electrode 124. The first lead electrode 123 and the second lead electrode 124 may be formed on the base substrate 110 during forming of the first electrodes 121 and the second electrodes 122, but are not limited thereto.

The ultra-small LED devices 130 are connected to the electrode line 120. The type of the ultra-small LED devices 130 is not limited, provided that they can be used in, for example, an illumination device or a display panel. A length L of the ultra-small LED device 130 may be, for example, in a range of 100 nm to 10 µm, and preferably, a range of 500 nm to 5 µm. Here, a highly efficient ultra-small LED device is difficult to manufacture when the length L of the ultra-small LED device 130 is less than 100 nm, and luminous efficiency of a ultra-small LED device may be deteriorated when the length L of the ultra-small LED device 130 is greater than 10 µm.

The ultra-small LED device 130 may have various shapes, e.g., a cylindrical shape, a square pillar shape, etc., and preferably, the cylindrical shape, but is not limited thereto.

The ultra-small LED device 130 may be a nanorod, a nanocable, a nano cotton ball, or a nano-dumbbell.

For example, in order to place the ultra-small LED devices 130 on the electrode line 120 during the manufacture of the ultra-small LED electrode assembly 100, a method in which a solution containing the ultra-small LED devices 130 is discharged onto the electrode line 120 may be used.

Here, the solution containing the ultra-small LED devices 130 may be, for example, prepared by mixing the plurality of ultra-small LED devices 130 with a solvent. The solution may be ink or be in the form of paste. The solvent may preferably include at least one selected from the group consisting of acetone, water, alcohol, and toluene, and be more preferably acetone. However, the type of the solvent is not limited thereto, and any solvent which is evaporable without physically or chemically influencing the ultra-small LED devices 130 may be used without limitation.

In the solution, a content of the ultra-small LED devices 130 may be in a range of 0.001 to 100 parts by weight with respect to 100 parts by weight of the solvent. When the content of the ultra-small LED devices 130 is less than 0.001 parts by weight, the number of ultra-small LED devices 130 connected to the electrodes is small and thus the ultra-small LED electrode assembly 100 may not be operated normally. To solve this problem, the solution may need to be discharged onto the electrode line 120 several times. When the content of the ultra-small LED devices 130 is greater than 100 parts by weight with respect to 100 parts by weight of the solvent, alignment of each of the ultra-small LED devices 130 may be interfered with each other.

FIGS. 5A, 5B, 5C, 5D and 5E are diagrams illustrating various modified examples of an electrode line.

Figure 5A:
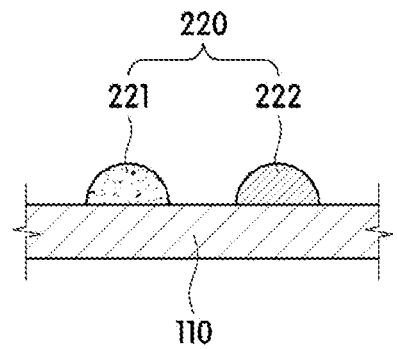
FIGS. 5A, 5B, 5C, 5D and 5E are diagrams illustrating various modified examples of an electrode line.
Figure 5B:
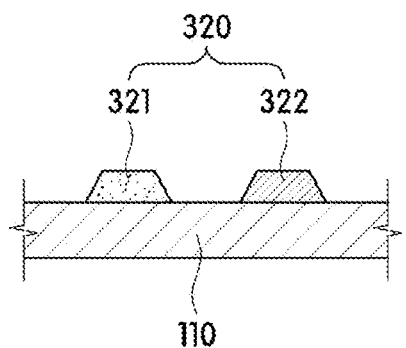
Figure 5C:
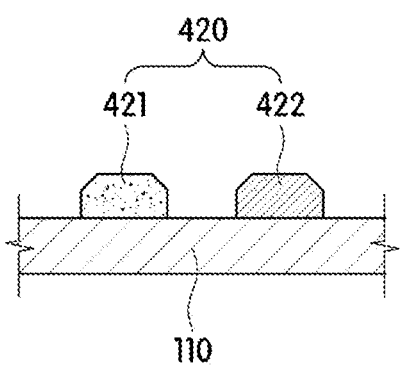

Referring to FIGS. 5A, 5B, 5C, 5D and 5E, in the ultra-small LED electrode assembly 100 according to the first embodiment of the present invention, a cross section of at least one of the first and second electrodes 121 and 122 in a vertical direction may have a shape selected from among a semicircular shape of an electrode line 220 illustrated in FIG. 5A, a polygonal shape of electrode lines 320 and 420 illustrated in FIGS. 5B and 5C, and a center-protruding shape of the electrode line 120 (see FIG. 2).

In the ultra-small LED electrode assembly 100 having the above structure according to the first embodiment of the present invention, the electrode line 120 has a three-dimensional (3D) shape, unlike in a structure having an electrode line formed to a certain thickness, and thus, a large number of ultra-small LED devices 130 may come into contact with the electrode line 120 during the placing of the ultra-small LED devices 130 on the electrode line 120.

Figure 5D:
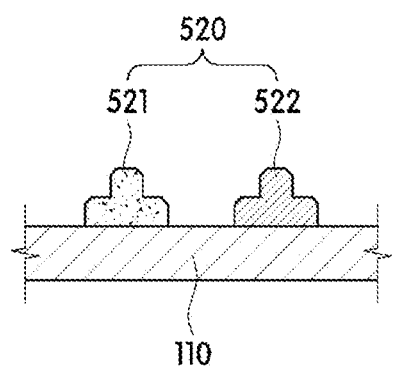
Figure 5E:
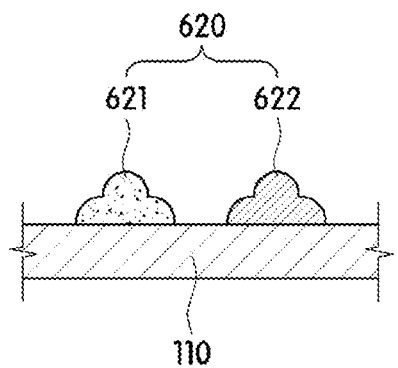

At least one among corners of the first electrode 121 or the second electrode 122 having the center-protruding shape may be chamfered, similar to corners of an electrode line 520 illustrated in FIG. 5D. Alternatively, at least one among the corners of the first electrode 121 or the second electrode 122 having the center-protruding shape may be rounded, similar to corners of an electrode line 620 illustrated in FIG. 5E.

Since the electrode lines 220, 320, 420, 520, and 620 have various shapes as described above, when the ultra-small LED devices 130 (see FIG. 3) are in contact with the electrode line 120, a contact area between the ultra-small LED devices 130 and the electrode line 120, 220, 320, 420, 520, or 620 is highly probably increased. Accordingly, the amount of photons discharged into the atmosphere from the ultra-small LED electrode assembly 100 (see FIG. 3) according to the first embodiment of the present invention may increase and thus light extraction efficiency may be remarkably improved.

Referring back to FIG. 3, the center-protruding shape of the electrode line 120 will be described in more detail. Each of the first and second electrodes 121 and 122 of the electrode line 120 may include, for example, a mounting portion 121a and a protruding portion 121b.

The mounting portion 121a may be mounted on the base substrate 110. For example, in order to form the mounting portion 121a on the base substrate 110, a photolithography method generally used to form an electrode on a substrate in a general semiconductor manufacturing process may be used but embodiments are not limited thereto.

The protruding portion 121b may upwardly protrude from a central region of the mounting portion 121a. For example, when the mounting portion 121a is divided into three parts in a widthwise direction, the protruding portion 121b may protrude from a midpoint on the mounting portion 121a. That is, a width of the protruding portion 121b in a direction from left to right may be less than that of the mounting portion 121a in the direction from left to right.

The protruding portion 121b may be formed on an upper surface of the mounting portion 121a and in the form of line in a lengthwise direction of the mounting portion 121a. The protruding portion 121b may be integrally formed with the mounting portion 121a. A thickness of the protruding portion 121b may be equal to that of the mounting portion 121a but is not limited thereto.

The ultra-small LED device 130 may have a pillar shape. In this case, a distance D1 between the protruding portion 121b of the first electrode 121 and the protruding portion 121b of the second electrode 122 adjacent thereto may be greater than or equal to the length L of the ultra-small LED device 130. Thus, the ultra-small LED device 130 may be interposed in a lying state between the first electrode 121 and the second electrode 122.

In contrast, when the distance D1 between the protruding portion 121b of the first electrode 121 and the protruding portion 121b of the second electrode 122 adjacent thereto is less than the length L of the ultra-small LED device 130, it may be difficult to place the ultra-small LED device 130 between the first electrode 121 and the second electrode 122.

A distance D2 between the mounting portion 121a of the first electrode 121 and the mounting portion 121a of the second electrode 122 adjacent thereto may be less than the length L of the ultra-small LED device 130. Thus, the ultra-small LED device 130 may be connected ranging from the first electrode 121 to the second electrode 122.

In contrast, when the distance D2 between the mounting portion 121a of the first electrode 121 and the mounting portion 121a of the second electrode 122 adjacent thereto is greater than the length L of the ultra-small LED device 130, the ultra-small LED device 130 may be connected to only one or none of the first electrode 121 and the second electrode 122 while being interposed between the first electrode 121 and the second electrode 122.

In the ultra-small LED electrode assembly 100 having the above structure according to the first embodiment of the present invention, the electrode line 120 has the 3D shape. Accordingly, when the ultra-small LED devices 130 are placed on the electrode line 120 during the manufacture of the ultra-small LED electrode assembly 100 according to the first embodiment of the present invention, a relatively larger number of ultra-small LED devices 130 may come into contact with the electrode line 120, when compared to a structure including an electrode line formed to a certain thickness.

Accordingly, the amount of photons discharged to the outside from the ultra-small LED electrode assembly 100 may increase and thus the light extraction efficiency of the ultra-small LED electrode assembly 100 may be remarkably improved.

Figure 6:
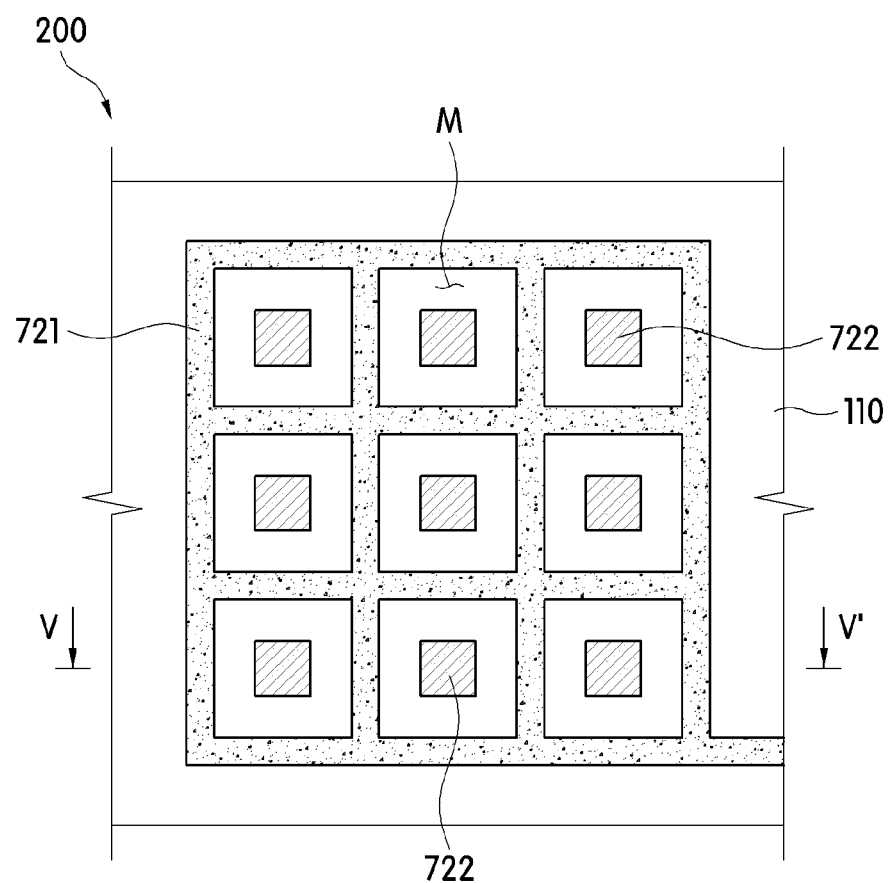
FIG. 6 is a diagram illustrating a ultra-small LED electrode assembly according to a second embodiment of the present invention.
Figure 7:
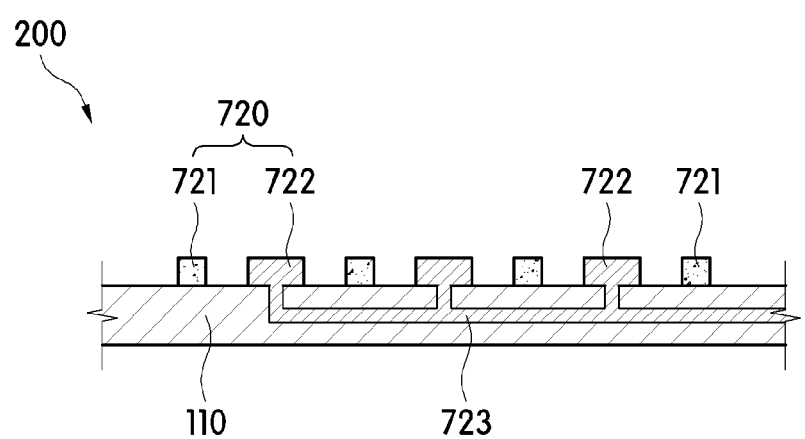
FIG. 7 is a cross-sectional view taken along line V-V' of the ultra-small LED electrode assembly of FIG. 6.

FIG. 6 is a diagram illustrating a ultra-small LED electrode assembly according to a second embodiment of the present invention. FIG. 7 is a cross-sectional view taken along line V-V' of the ultra-small LED electrode assembly of FIG. 6.

Referring to FIGS. 6 and 7, a ultra-small LED electrode assembly 200 according to the second embodiment of the present invention includes a base substrate 110, an electrode line 720, and ultra-small LED devices.

Here, the base substrate 110 and the ultra-small LED devices may be respectively substantially the same as the base substrate 110 (see FIG. 1) and the ultra-small LED devices 130 (see FIG. 3) of the above-described ultra-small LED electrode assembly 100 (see FIG. 1) according to the first embodiment and thus are not described in detail here.

The electrode line 720 includes first electrodes 721 and second electrodes 722. The second electrodes 722 are formed spaced apart from the first electrodes 721. One of the first and second electrodes 721 and 722 has a lattice shape in which a penetration portion M is patterned. The other of the first and second electrodes 721 and 722 is provided in an island form and located in the penetration portion M.

For example, the first electrode 721 may have a lattice form including the penetration portion M having a tetragonal shape. The second electrode 722 may have a tetragonal shape which is smaller in size than the penetration portion M and be located at a center of the penetration portion M of the first electrode 721.

More specifically, in the first electrode 721, the penetration portion M may be repeatedly patterned in multiple directions. When the penetration portion M of the first electrode 721 has a square shape, the second electrode 722 may also have a square shape. Accordingly, the distances between the first and second electrodes 721 and 722 may be uniform.

Here, although not shown, when the first electrode 721 has the lattice shape, a cross section of the first electrode 721 in a vertical direction may be a shape selected from among a semicircular shape, a polygonal shape, and a center-protruding shape. These shapes have been described above and thus are not described in detail here.

When the second electrode 722 has the lattice shape, a plane of the second electrode 722 may have a shape selected from among a circular shape and a polygonal shape.

An example of an inner structure of the ultra-small LED electrode assembly 200 according to the second embodiment of the present invention will now be described. Here, for convenience of explanation, it is assumed that the first electrode 721 has the lattice shape and the second electrode 722 is located in the penetration portion M of the first electrode 721.

As illustrated in FIG. 7, the first electrode 721 having the lattice shape may be connected to a second lead electrode (not shown) formed on an upper surface of the base substrate 110. The plurality of second electrodes 722 may be electrically connected to each other via a connection line 723 formed in the base substrate 110. The connection lines 723 may be connected to a first lead electrode (not shown).

In the ultra-small LED electrode assembly 200 having the above structure according to the second embodiment of the present invention, one of the first and second electrodes 721 and 722 has the lattice shape, unlike in the above-described ultra-small LED electrode assembly 100 according to the first embodiment of the present invention (see FIG. 1).

Accordingly, even when the ultra-small LED devices 130 (see FIG. 3) are placed on the first and second electrodes 721 and 722 in various directions, a probability that the ultra-small LED devices 130 will be stably connected to the first and second electrodes 721 and 722 may be higher than in the above-described ultra-small LED electrode assembly 100 (see FIG. 1) according to the first embodiment of the present invention.

Figure 8:
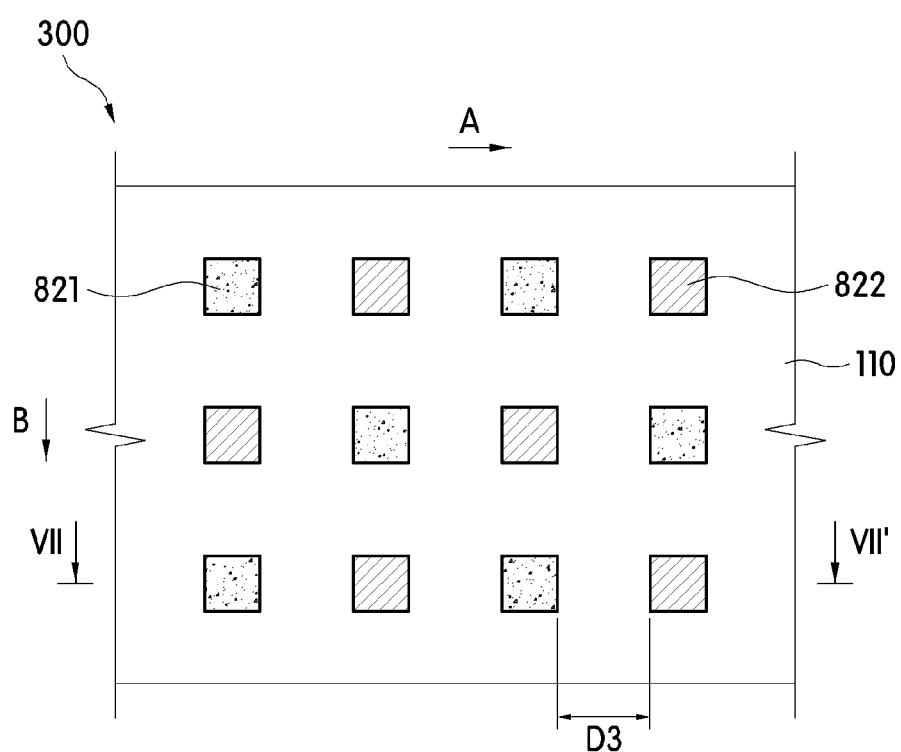
FIG. 8 is a diagram illustrating a ultra-small LED electrode assembly according to a third embodiment of the present invention.
Figure 9:
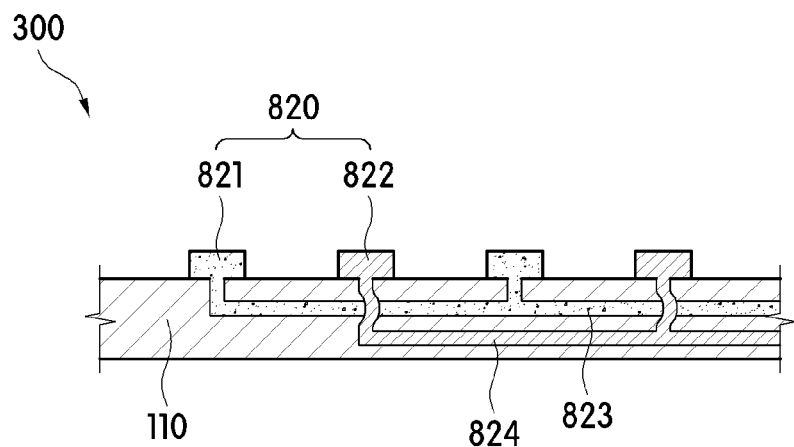
FIG. 9 is a cross-sectional view taken along lone VII-VII' of the ultra-small LED electrode assembly of FIG. 8.

FIG. 8 is a diagram illustrating a ultra-small LED electrode assembly according to a third embodiment of the present invention. FIG. 9 is a cross-sectional view taken along lone VII-VII' of the ultra-small LED electrode assembly of FIG. 8.

Referring to FIGS. 8 and 9, a ultra-small LED electrode assembly 300 according to the third embodiment of the present invention includes a base substrate 110, an electrode line 820, and the ultra-small LED devices 130 (see FIG. 3).

Here, the base substrate 110 and the ultra-small LED devices 130 are as described above with respect to the above-described ultra-small LED electrode assembly 100 (see FIG. 1) according to the first embodiment and thus are not described in detail here.

In the ultra-small LED electrode assembly 300 according to the third embodiment of the present invention, first electrodes 821 and second electrodes 822 of the electrode line 820 may be formed on the base substrate 110 and patterned to be interdigitated with each other while spaced apart from each other. To this end, the first electrodes 821 and the second electrodes 822 are in the form of an island. Each of the first and second electrodes 821 and 822 may be isolated from each other. That is, the first and second electrodes 821 and 822 may be formed on the base substrate 110 not to be connected to but to be separated from each other.

The first and second electrodes 821 and 822 may be located to be interdigitated with each other while spaced at a certain distance from each other in multiple directions. More specifically, the first and second electrodes 821 and 822 may be arranged in a matrix on the base substrate 110.

In one embodiment of the present invention, as illustrated in FIG. 8, the first and second electrodes 821 and 822 are arranged on the base substrate 110 to be interdigitated with each other in a first direction (indicated by an arrow A in FIG. 8) and in a second direction (indicated by an arrow B in FIG. 8) perpendicular to the first direction. In this case, the first and second electrodes 821 and 822 may be arranged adjacent to each other on the base substrate 110 to be interdigitated with each other.

Here, a distance D3 between the first and second electrodes 821 and 822 may be less than the length L of the ultra-small LED device 130 (see FIG. 2). Thus, the ultra-small LED devices 130 may be stably connected to the first and second electrodes 821 and 822.

The length L of the ultra-small LED device 130 (see FIG. 2) may be changed according to design, and the distance D3 between the first and second electrodes 821 and 822 may be changed in connection with the length L of the ultra-small LED device 130. Accordingly, the distance D3 between the first and second electrodes 821 and 822 is not limited by a specific value herein.

A plane of each of the first and second electrodes 821 and 822 may have a shape selected from among a circular shape and a polygonal shape. For example, as illustrated in FIG. 8, the plane of each of the first and second electrodes 821 and 822 may have a square shape. Although not shown in FIG.

8, the plane of each of the first and second electrodes 821 and 822 may have a rectangular shape, a pentagonal shape, or a hexagonal shape.

An example of an inner structure of the ultra-small LED electrode assembly 300 according to the third embodiment of the present invention will be described below.

As illustrated in FIG. 9, a first connection line 823 and a second connection line 824 may be formed in the base substrate 110. The first connection line 823 and the second connection line 824 may be formed such that electricity is not conducted therebetween. To this end, the base substrate 110 may be a multilayer printed circuit board, and the first connection line 823 and the second connection line 824 may be formed on different layers.

For example, the first connection line 823 may be connected to the first electrodes 821 and the second connection line 824 may be connected to the second electrodes 822 by forming via-holes in the multilayer printed circuit board. That is, the first electrodes 821 may be electrically connected to each other via the first connection line 823. The first connection line 823 may be connected to a first lead electrode (not shown). The second electrodes 822 may be electrically connected to each other via the second connection line 824. The second connection line 824 may be connected to a second lead electrode (not shown).

In the ultra-small LED electrode assembly 300 having the above structure according to the third embodiment of the present invention, areas occupied by the first and second electrodes 821 and 822 respectively on the base substrate 110 may be the same, when compared to the above-described ultra-small LED electrode assembly 200 (see FIG. 6) according to the second embodiment.

Figure 10:
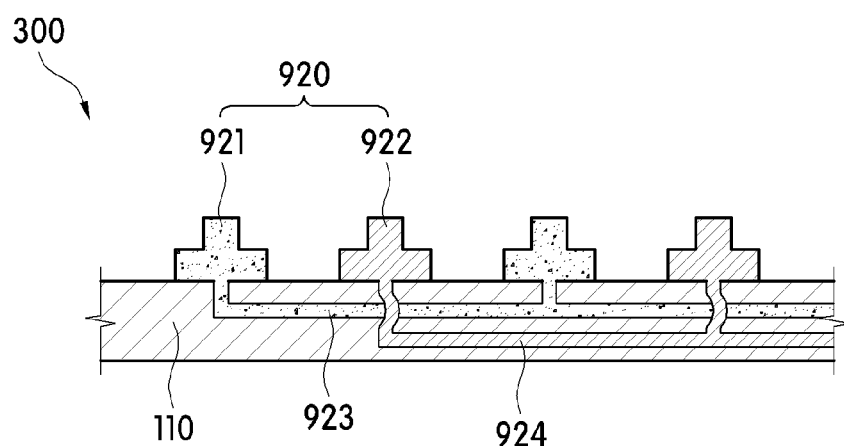
FIG. 10 is a diagram illustrating a ultra-small LED electrode assembly according to a fourth embodiment of the present invention.

As illustrated in FIG. 10, an electrode line 920 included in the ultra-small LED electrode assembly 300 according to the third embodiment of the present invention is a modified example, in which a cross section thereof in a vertical direction may have a shape selected from among a semicircular shape, a polygonal shape, and a center-protruding shape.

The center-protruding shape of the cross section of the electrode line 920 in the vertical direction is illustrated in FIG. 10. The semicircular shape or the polygonal shape of the cross section of the electrode line 920 in the vertical direction may be described with reference to the shapes of the electrode lines 220, 320, 420, 520, and 620 illustrated in FIGS. 5A, 5B, 5C, 5D and 5E.

Figure 11:
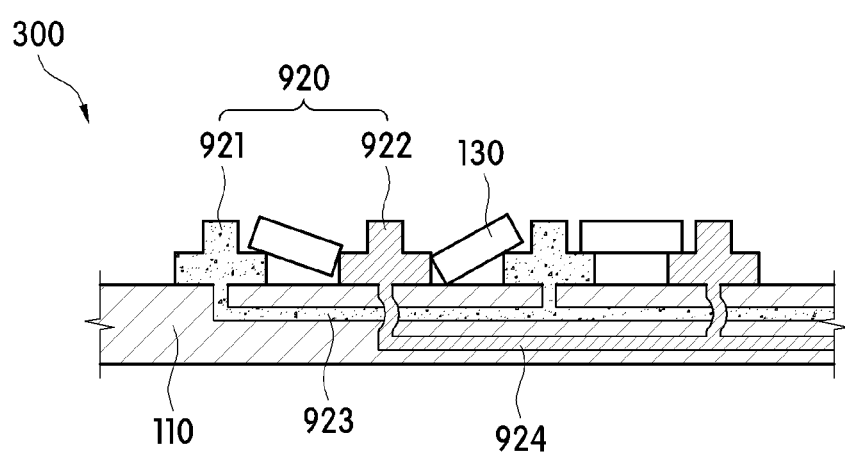
FIG. 11 is a diagram illustrating a state in which ultra-small LED devices are connected to an electrode line in the ultra-small LED electrode assembly of FIG. 10.

As described above, the ultra-small LED electrode assembly 300 includes the electrode line 920 according to the modified example. Accordingly, as illustrated in FIG. 11, a large number of ultra-small LED devices 130 may come into contact with the electrode line 920 during placing of a plurality of ultra-small LED devices 130 on the electrode line 920.

While various embodiments of the present invention have been described above, the drawings referred to herein and the detailed description of the present invention are merely intended to provide examples of the present invention, and are for the purpose of describing the present invention only and are not intended to limit meanings or the scope of the present invention defined in the claims. Thus, it will be apparent to those of ordinary skill in the art that various modifications may be made in the embodiments and equivalent embodiments may be derived from the embodiments. Accordingly, the scope of the present invention to be protected should be determined by the technical scope defined in the appended claims.

The invention claimed is:

1. A light-emitting diode (LED) electrode assembly comprising:
   a base substrate;
   a first electrode and a second electrode on the base substrate extending to a first direction and being apart from each other in a second direction;
   a first lead electrode and a second lead electrode extending to the second direction, and connected to the first electrode and the second electrode, respectively; and
   a plurality of LED devices connected to the first and second electrodes and having a shape extending to one direction,
   wherein the first electrode and the second electrode are disposed between the first lead electrode and the second lead electrode,
   a first thickness of the first and second electrodes which is a thickness of a center portion of the first and second electrodes is greater than a second thickness of the first and second electrodes which is a thickness of a side portion of the first and second electrodes, and
   one end portion of the plurality of LED devices is disposed on the side portion of the first electrode, and another end portion of the plurality of LED devices is disposed on the side portion of the second electrode.

2. The LED electrode assembly of claim 1, wherein a cross section of at least one of the first and second electrodes in a vertical direction has a shape selected from among a semicircular shape, a polygonal shape, and a center-protruding shape.

3. The LED electrode assembly of claim 2, wherein at least one among corners of the first or second electrode having the center-protruding shape is chamfered.

4. The LED electrode assembly of claim 2, wherein at least one among corners of the first or second electrode having the center-protruding shape is rounded.

5. The LED electrode assembly of claim 1, wherein each of the first and second electrodes comprises:
   a mounting portion mounted on the base substrate; and
   a protruding portion upwardly protruding from a central region of the mounting portion.

6. The LED electrode assembly of claim 5, wherein the at least one LED device has a pillar shape,
   a distance between the protruding portion of the first electrode and the protruding portion of the second electrode adjacent thereto is greater than or equal to a length of the at least one LED device, and
   a distance between the mounting portion of the first electrode and the mounting portion of the second electrode adjacent thereto is less than the length of the at least one LED device.

\* \* \* \* \*